United States Patent
Tanabe et al.

[11] Patent Number: 6,136,505
[45] Date of Patent: Oct. 24, 2000

[54] LIQUID COATING COMPOSITION FOR USE IN FORMING ANTIREFLECTIVE FILM AND PHOTORESIST MATERIAL USING SAID ANTIREFLECTIVE FILM

[75] Inventors: Masahito Tanabe; Kazumasa Wakiya; Masakazu Kobayashi; Hiroshi Komano; Toshimasa Nakayama, all of Kanagawa-ken, Japan

[73] Assignee: Tokyo Ohka Kogyo Co., Ltd., Kanagawa-ken, Japan

[21] Appl. No.: 09/330,001

[22] Filed: Jun. 11, 1999

[30] Foreign Application Priority Data

Jun. 12, 1998 [JP] Japan .................................. 10-164600

[51] Int. Cl.[7] ...................................................... G03F 7/11
[52] U.S. Cl. ........................................ 430/273.1; 526/237
[58] Field of Search .......................... 430/273.1; 526/237

[56] References Cited

U.S. PATENT DOCUMENTS

| | | | |
|---|---|---|---|
| 5,136,002 | 8/1992 | Sugimori et al. | 526/247 |
| 5,155,796 | 10/1992 | Oonishi et al. | 385/143 |
| 5,965,294 | 10/1999 | Hamada | 429/218.2 |

FOREIGN PATENT DOCUMENTS

| | | |
|---|---|---|
| 0 522 990 | 1/1993 | European Pat. Off. . |
| 62-62520 | 3/1987 | Japan . |
| 3-222409 | 10/1991 | Japan . |
| 5-74700 | 3/1993 | Japan . |
| 5-188598 | 7/1993 | Japan . |
| 5-241332 | 9/1993 | Japan . |
| 6-110210 | 4/1994 | Japan . |
| 09255370 | 9/1997 | Japan . |

*Primary Examiner*—Cynthia Hamilton
*Attorney, Agent, or Firm*—Wenderoth, Lind & Ponack, L.L.P.

[57] ABSTRACT

Disclosed herein is a liquid coating composition for use in forming an antireflective film comprising a mixture of a cyclic perfluoroalkyl polyether and a chain perfluoroalkyl polyether in a ratio of from 3:10 to 10:1 by weight, and a fluorocarbon organic solvent. Disclosed also herein is a photoresist material consisting of a photoresist layer and said antireflective film formed thereon using said liquid coating composition. The antireflective film remarkably reduces the standing-wave effect especially in the case where the photoresist layer of chemically amplified type is used. The antireflective film also has good film quality and film removability.

7 Claims, No Drawings

LIQUID COATING COMPOSITION FOR USE IN FORMING ANTIREFLECTIVE FILM AND PHOTORESIST MATERIAL USING SAID ANTIREFLECTIVE FILM

BACKGROUND OF THE INVENTION

1. Field of the Invention

This invention relates to a liquid coating composition for use in forming an antireflective film, as well as a photoresist material using said antireflective film. More specifically, the invention relates to a liquid coating composition for use in forming an antireflective film which is capable of sufficiently reducing the multiple interference of light occurred in a photoresist layer during patterning by photolithography, and thereby keeping the dimensional precision of a photoresist pattern. The invention also relates to a photoresist material consisting of a photoresist layer and said antireflective film formed thereon using said liquid coating composition. The invention is advantageously applied to the photoresist layer of chemically amplified type.

2. Description of Related Art

Photolithography as employed in the fabrication of semiconductor devices comprises the steps of providing a photoresist layer on a substrate such as a silicon wafer, selectively exposing it to light with an actinic radiation such as UV light, far UV light, excimer laser, X-rays or electron beams, and performing development to form a photoresist pattern on the substrate. Photoresists are of two types. A negative photoresist is such that the unexposed area is dissolved away during development, while a positive photoresist has the exposed area dissolved away. Either type of photoresists are selectively used as appropriate for a specific object.

With the recent improvement in the degree of integration of semiconductor devices, R & D efforts are being directed to production equipment adapted for microelectronic fabrication technology. Under the circumstances, the use of exposing equipment that operates on short-wavelength actinic radiations such as g-line, i-line or excimer laser is increasing because of its compatibility with microelectronic fabrication technology.

In the formation of photoresist patterns by photolithography, incident light is known to undergo multiple interference in the photoresist layer and that causes variations in the linewidth of photoresist patterns with varying thicknesses of the photoresist layer. The cause of this multiple interference effect of light is as follows: exposing to light falling at a short wavelength on the photoresist layer interferes with the reflected light from the underlying substrate so that the absorption of light energy varies with the thickness of the photoresist layer. The multiple interference occurs a phenomenon known as "standing-wave effect" which gives a wavy cross-section to the photoresist layer, resulting in thickness variation. Variations in the thickness of the photoresist layer will adversely affect the linewidth of the developed photoresist pattern and eventually degrade its dimensional precision. When forming a fine pattern on a substrate having steps, this phenomenon presents an unavoidable serious problem since the thickness of the photoresist layer inevitably differs at different heights of each step. Therefore, it is desired to develop a technology that eliminates the multiple interference effect of light to insure that the dimensional precision of fine patterns will not be degraded even if they are formed on a substrate having steps.

It has heretofore been proposed that the multiple interference effect of light be lessened by forming an antireflective (anti-interference) film onto a surface of a substrate (see U.S. Pat. No. 4,910,122), or by first forming a photoresist layer onto a substrate and then forming a film of a water-soluble resin, such as polysiloxane or polyvinyl alcohol, as an antireflective film over the photoresist layer (see Japanese Patent Publication (Kokoku) No. 55323/1992, Japanese Patent Public Disclosure (Kokai) No. 222409/1991, etc.). The first approach is effective to some extent in lessening the multiple interference effect of light, however, if light having the same wavelength as exposing light is used in mask alignment, the antireflective film will attenuate the alignment detection signal, making it difficult to achieve high alignment accuracy. Additionally, the photoresist has to be transferred patternwise and precisely onto the antireflective film, which must thereafter be etched or otherwise stripped away without affecting the device being fabricated. Since this increases unavoidably the number of process steps involved, the first approach which comprises forming the antireflective film onto a surface of the substrate is not applicable to all cases of substrate processing. On the other hand, the second approach which comprises forming an antireflective film onto a photoresist layer over the substrate is practical since it does not require an intricate process, however, it is not satisfactory in their anti-interference action. As the slightest interference effect can influence significantly the dimensional precision of photoresist patterns if they are very fine and, therefore, antireflective films available today are incapable of meeting the recent demand for smaller feature sizes in the fabrication of semiconductor devices. Under the circumstances, there is a strong need to develop a more effective antireflective film.

In addition, the latest integrated circuits need an extremely fine pattern having a width of about 0.2–0.3 $\mu$m or even less. In line with such technical advancement, the conventional photoresist composition for g-line or i-line is being replaced by that of chemically amplified type for deep UV having a wavelength of about 248 nm or less. Requirements for antireflective films are shifting accordingly.

The chemically amplified photoresist composition is highly transparent for high resolution, and therefore, is highly vulnerable to the standing-wave effect. For these reasons, roles of antireflective films overlaid on the chemically amplified photoresist composition have become more important than ever.

From the principle of reflection, the standing-wave effect may be reduced if the refractive index (n) of the antireflective film is equal to a square root of the refractive index (n') of the photoresist layer for exposure light. The antireflective film for the conventional photoresist composition for g-line or i-line should optimally have a refractive index (n) of about 1.29, whereas the antireflective film for the highly transparent chemically amplified photoresist composition for deep UV should optimally have a refractive index (n) of about 1.34–1.36. Therefore, for the chemically amplified photoresist composition for deep UV, it is desired to use an antireflective film having an optimal refractive index corresponding to said composition as described above.

The antireflective film should meet not only the requirement for said refractive index but also the requirement for film quality, that is, an adequate degree of hardness. If the film is excessively soft, it will deform or drip when a silicon wafer is transferred, with a photoresist material thereon of a photoresist layer overlaid with said excessively soft antireflective film, and whereby contaminating the nearby placed apparatus. Further, the antireflective film needs to be removed easily. However, if it is excessively soft, it may not be removed completely from the underlying photoresist layer, which hampers the subsequent development of the photoresist layer.

Conventional photoresist materials of a dual structure comprising a photoresist layer overlaid with an antireflective film have been proposed in Japanese Patent Public Disclosure (Kokai) Nos. 62520/1987, 241332/1993, 110210/1994 and 74700/1993, etc.

Kokai No. 62520/1987 teaches a photoresist material with an antireflective film formed from a perfluoroalkyl compound of perfluoroalkyl polyether, perfluoroalkylamine, or a mixture thereof. However, the said antireflective film has a refractive index of about 1.30, and therefore, it is suitable for a photoresist composition which responds to g-line or i-line. The antireflective film does not have a refractive index of about 1.34–1.36 being required in using a chemically amplified photoresist composition that responds to deep UV. Therefore, the antireflective film in Kokai No. 62520/1987 does not reduce the standing-wave effect when used in combination with the chemically amplified photoresist. It cannot provide a fine pattern required of the latest integrated circuits.

Kokai No. 241332/1993 teaches a photoresist material with an antireflective film formed from a solvent solution wherein fluorine-base resins dissolved. As fluorine-base resins, a cyclic perfluoroalkyl polyether and a chain perfluoroalkyl polyether are exemplified. However, for forming the antireflective film, those two types of perfluoroalkyl polyethers are independently used, and that they are not used in admixed with each other. The antireflective film is being able to adapt to a photoresist of chemically amplified type, however, it could not achieved a sufficiently satisfied advantageous effects in film quality and in film removability.

Kokai No. 110210/1994 teaches a photoresist material with an antireflective film of a gas-impermeable polymer film formed from a fluorine-containing polymer. The gas-impermeable polymer film protects an underlying photoresist layer of chemically amplified type from its atmosphere, by which gives a photoresist pattern in good shape. On the other hand, the antireflective film of the present invention keeps a photoresist pattern in good shape by means of suppressing the multiple interference effects in a photoresist layer. The technical concepts of the present invention differ from those of the invention of Kokai No. 110210/1994. Furthermore, it discloses examples employing a cyclic perfluoroalkyl compound as the fluorine-containing polymer, but it does not teach a chain perfluoroalkyl compound.

Kokai No. 74700/1993 teaches a photoresist material with an antireflective film formed from a solvent solution of a resin obtained by polymerization of a perfluoroalkyl compound having unsaturated bonds. The said antireflective film is being able to adapt to a photoresist of chemically amplified photoresists, however, it is not satisfactory in film quality and film removability, and therefore it is not suitable for fine patterning.

The present inventors conducted intensive studies with a view to solving these problems of the prior art and found that their objective could be attained by forming an antireflective film using a liquid coating composition comprising a mixture of a cyclic perfluoroalkyl polyether and a chain perfluoroalkyl polyether in a specific ratio by weight dissolved in a fluorocarbon organic solvent. The present invention was completed on the basis of this findings.

SUMMARY OF THE INVENTION

An object, therefore, of the invention is to provide a liquid coating composition suitable for use in forming an antireflective film overlying a photoresist layer which reduces the standing-wave effect occurred in the photoresist layer, especially of a chemically amplified one, and has an adequate degree of hardness, as well as can form a satisfactory photoresist pattern having high fidelity to a mask pattern.

Another object of the present invention is to provide a photoresist material using said antireflective film.

In its first aspect, the invention provides a liquid coating composition for use in forming an antireflective film comprising a mixture of a cyclic perfluoroalkyl polyether and a chain perfluoroalkyl polyether in a ratio of from 3:10 to 10:1 by weight, and a fluorocarbon organic solvent.

In its second aspect, the invention provides a photoresist material comprising a photoresist layer and an antireflective film formed thereon by using the liquid coating composition as defined above.

DETAILED DESCRIPTION OF THE INVENTION

The cyclic perfluoroalkyl polyether used in the present invention is preferably exemplified as a polymer having the constitutional unit represented by the following formula (I):

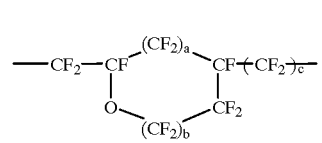

(I)

wherein a and b are each independently a numeral of 0–3, and c is an integer of 1–3.

The said polymer is commercially available under a trade name of "Cytop" (product of Asahi Glass Co., Ltd.).

The cyclic perfluoroalkyl polyether may also be preferably exemplified as a polymer having the constitutional unit represented by the following formula (II):

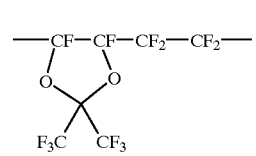

(II)

The said polymer is commercially available under a trade name of "Teflon AF1600" or "Teflon AF2400" (both are products of Du Pont Inc.).

The chain perfluoroalkyl polyether used in the present invention is preferably exemplified as a polymer represented by the following general formula (III):

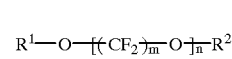

(III)

wherein $R^1$ and $R^2$ are each independently a perfluoroalkyl group having 1–6 carbon atoms; m is an integer of 1–5.

The said polymer is commercially available under trade names of "Demnam S-20", "Demnam S-65", "Demnam S-100", or "Demnam S-200" (all are products of Daikin Industries Ltd.). The first one is most preferred.

In the present invention, the cyclic perfluoroalkyl polyether and the chain perfluoroalkyl polyether are used in the form of a mixture, with the ratio by weight of the former to the latter being from 3:10 to 10:1, preferably from 6:10 to 10:2. If the former is used more than specified above, the resultant antireflective film is hardly removed off and the remaining unremoved film hamper the subsequent development of the photoresist layer. Conversely, if the former is used less than specified above, the resultant antireflective film is an excessively soft one.

One or more of the cyclic perfluoroalkyl polyethers and the chain perfluoroalkyl polyethers may be incorporated in the mixture thereof.

The fluorocarbon organic solvent in the present invention is not specifically restricted so long as it dissolves the above-mentioned mixture. Specific examples include perfluoroalkanes such as perfluorohexane or perfluoroheptane; perfluorocycroalkanes; perfluoroalkenes having double bond(s) therein; perfluoro cyclic ethers such as perfluorotetrahydrofuran or perfluoro(2-butyltetrahydrofuran); and amines such as perfluorotributylamine, perfluorotetrapentylamine, or perfluorotetrahexylamine. They may be used alone or in combination with one another. They may also be used in combination with any other compatible organic solvents or surfactants to improve solubility.

The polymer mixture should be dissolved in the above-mentioned fluorocarbon organic solvent such that the resulting solution has a concentration of about 1–10 wt %, preferably 2–5 wt %, to ensure good coating properties.

The liquid coating composition containing the polymer mixture dissolved in the fluorocarbon organic solvent may be incorporated with various additives, such as preservative, stabilizer, and surfactant, in an amount not harmful to the effect of the invention.

The photoresist material according to the second aspect of the invention is a dual structure comprising a photoresist layer overlaid with an antireflective film formed from the liquid coating composition described above.

Photoresists for use in the present invention are specifically restricted to and may be selected from among those that are in common use. While either positive or negative photoresists may be used, those which comprise a photosensitive material and a film-forming material and which are developable with aqueous alkalines are preferred.

Particularly advantageous photoresist compositions are positive or negative photoresist compositions having requisite characteristics that are well compatible with the recent microelectronic fabrication technology. A chemically amplified photoresist composition is especially desirable in the present invention.

A typical chemically amplified photoresist composition is one that contains a so-called acid generator which generates an acid upon exposure to actinic rays (e.g., light). A negative chemically amplified photoresist composition is usually composed of a base polymer, an acid generator, and a crosslinker. When the photoresist is exposed to light, the exposed area undergoes crosslinking due to the acid generated by irradiation, and the thus crosslinked area decreases in solubility in the developing solution. On the other hand, a positive chemically amplified photoresist composition may be either two-component type, or three-component type. That of two-component type is composed of a base polymer having a moiety blocked with a protective group that suppresses solubility, and an acid generator. That of three-component type is composed of a base polymer, an acid generator, and a solubility-suppressing agent. The acid generated by exposure separates the protective group of the polymer, thereby increasing the solubility in the developing solution. In the present invention, any known positive or negative chemically amplified photoresist compositions are preferably used. Particularly, those that have a refractive index of about 1.8–1.9 are most preferred.

The method of preparing and using the photoresist material according to the second aspect of the invention will now be described with reference to an example. First, a photoresist layer is formed on a substrate such as a silicon wafer in the usual manner. Thereafter, the liquid coating composition of the invention is applied onto the photoresist layer by spin coating. Then, the applied composition is heated to form an antireflective coating film over the photoresist layer to prepare the photoresist material of a dual structure. Heating of the applied composition may be omitted if its application is sufficient to form a highly uniform coat of satisfactory quality.

In the next exposure step, an actinic radiation such as UV light or far UV light (including an excimer laser) is selectively applied to the photoresist layer through the antireflective film.

The antireflective film has an optimal thickness for effective reduction of the interference effect of actinic radiations. The optimal thickness is an odd multiple of $\lambda/4n$ ($\lambda$, the wavelength of the actinic radiation used; n, the refractive index of the antireflective film). If the antireflective film has a refractive index of 1.35, its optimal thickness is an odd multiple of 46 nm for far UV light (excimer laser). In practical applications, the thickness of the antireflective film is preferably within ±5 nm of each value of the optimal thickness.

The antireflective film is preferably formed over the chemically amplified, negative or positive photoresist composition because it offers not only the anti-interference effect but also proves effective in improving the photoresist pattern profile. In semiconductor fabrication, chemically amplified photoresist compositions are subject to the action of the vapor of organic alkalies in ambient atmosphere, such as N-methyl-2-pyrrolidone, ammonia, pyridine and triethylamine, and acid deficiency will occur on the surface of the photoresist layer. If this is the case, the photoresist pattern tends to have a round top when the photoresist composition is of a negative type, or adjacent lines of the pattern may bridge to produce a visible flaw if the photoresist composition is a positive type. The improvement in the photoresist pattern profile means eliminating these defects to guarantee the formation of a rectangular pattern profiles. Thus, the antireflective film formed in accordance with the invention can also be used with advantages as a protective film for the chemically amplified photoresist compositions.

After exposure, the antireflective film is removed away before development of the photoresist layer. A typical method of stripping the antireflective film is by spraying the rotating silicon wafer on a spinner with a solvent that selectively removed away the antireflective film. Applicable solvents for removing the antireflective film are an above-mentioned fluorocarbon organic solvent or an aqueous solution incorporating a surfactant. In the present invention, the former is advantageous costwise because it can be recycled by distillation.

After that, the silicon wafer, with its antireflective film removed, undergoes development in the usual way. Thus, there is formed a photoresist pattern on the silicon wafer.

EXAMPLES

The following examples are provided for the purpose of further illustrating the present invention but are in no way to be taken as limiting.

Examples 1–3 and Comparative Examples 1–4

A mixture of a cyclic perfluoroalkyl ether and a chain perfluoroalkyl ether was prepared in a mixing ratio as shown in Table 1 below. This mixture was dissolved in perfluorotributylamine. Thus there was obtained a 2.5 wt % liquid coating composition for antireflective film.

A negative chemically amplified photoresist ("TDUR-N908PE" of Tokyo Ohka Kogyo Co., Ltd.) comprising a base polymer, an acid generator, and a crosslinking agent was applied onto eight 6-inch silicon wafers by spin coating. Subsequent drying on a hot plate at 90° C. for 90 seconds produced a photoresist layer on each of the eight silicon wafers.

Subsequently, the liquid coating composition was applied by spin coating onto the photoresist layer on each of the eight silicon wafers, and thereafter, soft-baked at 60° C. for 90 seconds to form antireflective films in thicknesses of 46 nm. Thusly, photoresist materials were obtained.

The antireflective films of the thusly-obtained photoresist materials were evaluated according to the criterion given below.

Each of the silicon wafers having the photoresist material formed thereon as mentioned above were exposed to light through a mask pattern by using NSR-2005EX8A (Nikon Corporation), followed by baking at 130° C. for 90 seconds on a hot plate.

The antireflective film was removed by dissolving in perfluoro(2-butyltetrahydrofuran).

The removability of the antireflective film was evaluated according to the criteria below.

With the antireflective film removed, the photoresists were developed with a 2.38 wt % aqueous solution of tetramethylammonium hydroxide (TMAH). The developed photoresist layers were washed with pure water to form photoresist patterns with a line width of 0.25 μm.

Items of evaluation:

[Film quality]

After applying liquid coating compositions onto the photoresist layers, followed by soft-baking them to form antireflective films onto photoresist layers, the surfaces of antireflective films were rubbed with a tweezer tip to check the hardness of the film. Results are shown in Table 1, in which ○ indicates that the film is sufficiently hard; and × indicates that the film is insufficiently hard, too soft.

[Film removability]

The antireflective film was checked to see whether it was completely removed from the photoresist layer when it was dissolved in perfluoro(2-butyltetrahydrofuran), and the developability of photoresist layers. Results are shown in Table 1, in which ○ indicates that that the film was completely removed and that the following development of the photoresist layer was performed satisfactorily; and × indicates that the film was incompletely removed and that the subsequent development of the photoresist layer could not be performed.

[Refractive index of film]

The antireflective film was measured for refractive index for light of wavelength 246 nm.

TABLE 1

|  | Polymers and their mixing ratio (by weight) | Film quality | Refractive index (246 nm) | Film removability |
|---|---|---|---|---|
| Ex. 1 | "Demnam S-20":"Cytop" = 5:3 | ○ | 1.35 | ○ |
| Ex. 2 | "Demnam S-20":"Cytop" = 5:5 | ○ | 1.35 | ○ |
| Ex. 3 | "Demnam S-20":"Cytop" = 1:5 | ○ | 1.35 | ○ |

TABLE 1-continued

|  | Polymers and their mixing ratio (by weight) | Film quality | Refractive index (246 nm) | Film removability |
|---|---|---|---|---|
| Comp. Ex. 1 | "Demnam S-20":"Cytop" = 5:0 | X | 1.30 | ○ |
| Comp. Ex. 2 | "Demnam S-20":"Cytop" = 0:5 | ○ | 1.36 | X |
| Comp. Ex. 3 | "Teflon AF":"Cytop" = 5:5 | ○ | 1.36 | X |
| Comp. Ex. 4 | "Demnam S-20":"Demnam S-100" = 5:5 | X | 1.30 | ○ |

It is apparent from Table 1 that the antireflective film in the present invention is superior in both film quality and film removability and has a refractive index of 1.34–1.36. Thus the antireflective film in the present invention is suitable for the photoresists of chemically amplified type.

In Examples 1–3, each of the antireflective film enabled the patterning with high precision faithful to the mask pattern. In Comparative Examples 2 and 3, each of the antireflective film was not removed completely, and that hampered the development and patterning of the photoresist layer. In Comparative Examples 1 and 4, each of the antireflective film was poor in film quality and hence the resulting pattern was poor in reproducibility and dimensional accuracy.

As detailed above, the present invention provides a liquid coating composition for use in forming an antireflective film that is capable of sufficiently reduce the standing-wave effect that is especially occurred in the chemically amplified photoresist layer, and is superior in its film quality and film removability. The present invention contributes to photolithography for microfabrication in semiconductor manufacturing, making it possible to form ultrafine patterns with a line width of about 0.2–0.3 μm with high dimensional accuracy.

What is claimed is:

1. A liquid coating composition for use in forming an antireflective film comprising a mixture of a cyclic perfluoroalkyl polyether and a chain perfluoroalkyl polyether in a ratio of from 3:10 to 10:1 by weight, and a fluorocarbon organic solvent.

2. The liquid coating composition according to claim 1, wherein the mixing ratio of the cyclic perfluoroalkyl polyether and the chain perfluoroalkyl polyether is from 6:10 to 10:2 by weight.

3. The liquid coating composition according to claim 1, wherein the cyclic perfluoroalkyl polyether is a polymer having the constitutional unit represented by the following formula (I):

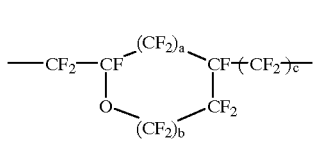

(I)

wherein a and b are each independently a numeral of 0–3, and c is an integer of 1–3.

4. The liquid coating composition according to claim 1, wherein the cyclic perfluoroalkyl polyether is a polymer having the constitutional unit represented by the following formula (II):

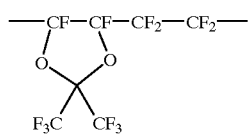

(II)

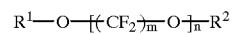

(III)

wherein $R^1$ and $R^2$ are each independently a perfluoroalkyl group having 1–6 carbon atoms; m is an integer of 1–5.

5. The liquid coating composition according to claim 1, wherein the chain perfluoroalkyl polyether is a polymer represented by the following general formula (III):

6. A photoresist material comprising a photoresist layer and an antireflective film formed thereon by using the liquid coating composition of claim 1.

7. The photoresist material according to claim 6, wherein the photoresist layer is formed by using a chemically amplified photoresist composition.

* * * * *